(12) United States Patent
Lee et al.

(10) Patent No.: US 11,934,107 B1
(45) Date of Patent: Mar. 19, 2024

(54) MASKLESS BASED LITHOGRAPHY METHODS

(71) Applicant: Applied Materials, Inc., Santa Clara, CA (US)

(72) Inventors: Shih-Hsien Lee, Hsinchu (TW); Tingwei Chiu, Taichung (TW); Frederick Lie, Dacun (TW); Jang Fung Chen, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/766,873

(22) PCT Filed: Oct. 9, 2019

(86) PCT No.: PCT/US2019/055407
§ 371 (c)(1),
(2) Date: Apr. 6, 2022

(87) PCT Pub. No.: WO2021/071484
PCT Pub. Date: Apr. 15, 2021

(51) Int. Cl.
*G03F 7/20* (2006.01)
*G03F 7/00* (2006.01)

(52) U.S. Cl.
CPC ........ *G03F 7/70558* (2013.01); *G03F 7/2051* (2013.01); *G03F 7/70625* (2013.01)

(58) Field of Classification Search
CPC ............... G03F 7/70558; G03F 7/2051; G03F 7/70625; G03F 7/0035; G03F 7/0037; H01L 21/0274
See application file for complete search history.

(56) References Cited

U.S. PATENT DOCUMENTS

2009/0317728 A1  12/2009  Oh et al.
2013/0065383 A1  3/2013  Qiu et al.
(Continued)

FOREIGN PATENT DOCUMENTS

JP  S64-24425 A  1/1989
JP  H7-254559 A  10/1995
(Continued)

OTHER PUBLICATIONS

International Search Report dated Jul. 8, 2020 for Application No. PCT/US2019/055407.
(Continued)

*Primary Examiner* — Mesfin T Asfaw
(74) *Attorney, Agent, or Firm* — Patterson & Sheridan LLP

(57) ABSTRACT

Embodiments described herein relate to methods of forming layers using maskless based lithography. In these embodiments, the methods implement ladders of dose change such that a geometric shape can be divided into overlaying sections. The overlaying sections can include a different dose of each section such that taper control can be achieved. The taper can be achieved by manipulating the geometry "mask data" into overlaying sections that are exposed by various doses controlled by pixel blending (PB) exposure techniques. To perform the methods described herein, a maskless lithography tool is used. The maskless lithography tool includes a controller that performs software based "mask data" manipulation. As such, because the methods are performed by software with no mask, there is much more flexibility to tune the taper angles and/or photoresist thickness residuals for multi-tone/gray tone mask features without any additional mask cost and fabrication time, providing advantages over conventional lithography methods using masks.

15 Claims, 8 Drawing Sheets

(56) References Cited

U.S. PATENT DOCUMENTS

2014/0152969 A1* 6/2014 Bleeker .............. G03F 7/70608
  355/67
2017/0068163 A1    3/2017 Laidig et al.
2018/0373153 A1   12/2018 Chen et al.

FOREIGN PATENT DOCUMENTS

JP    2012-37729 A    2/2012
WO   2011138237 A1   11/2011

OTHER PUBLICATIONS

J. Kim et al. "Controlling Resist Thickness and Etch Depth for Fabrication of 3D Structures in Electron-Beam Grayscale Lithography, Microelectronic Engineering", Dec. 31, 2007, Science Direct, https://www.sciencedirect.com/science/article/pii/S0167931707003164><doi.org/10.1016/j.mee.2007.02.015> pp. 2860-2861.

Japanese Office Action dated Jun. 27, 2023, for JP Application No. 2022-521505.

* cited by examiner

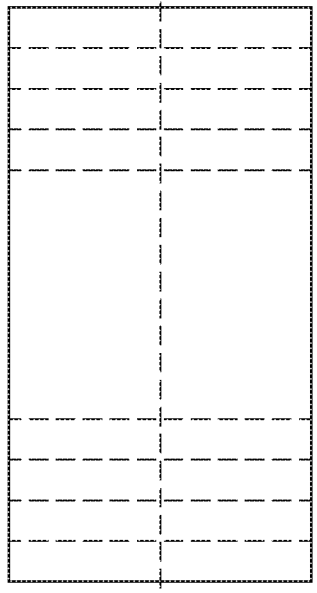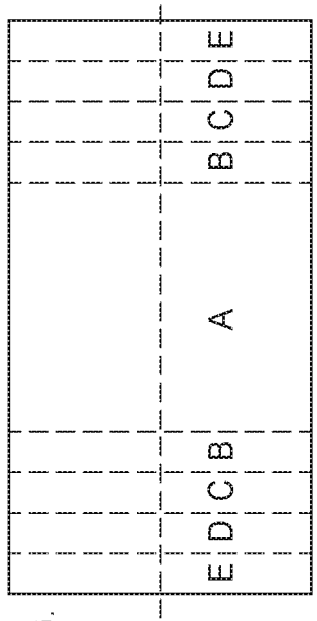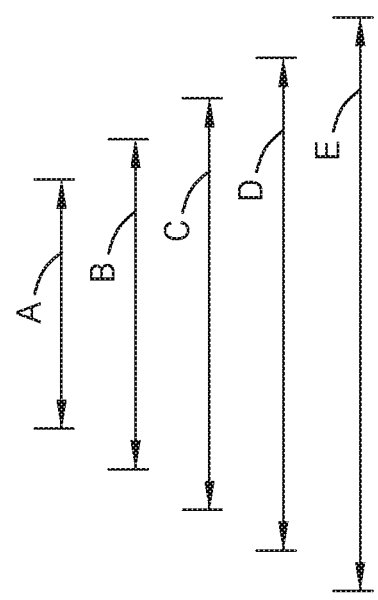
FIG. 6A
FIG. 6B

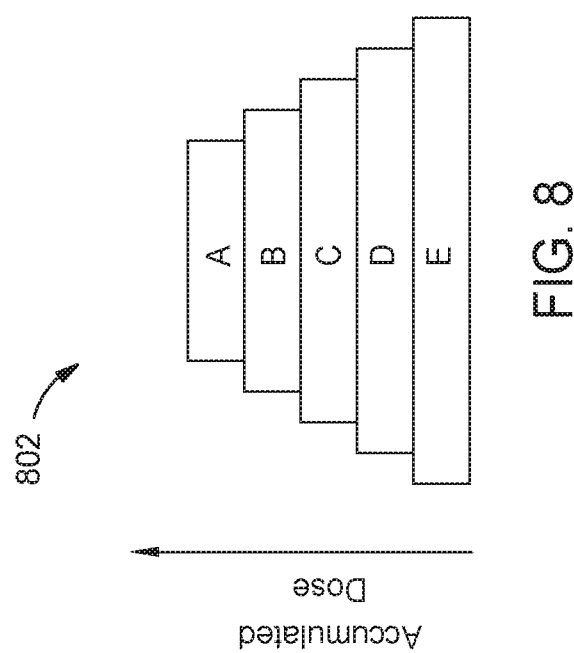
FIG. 8
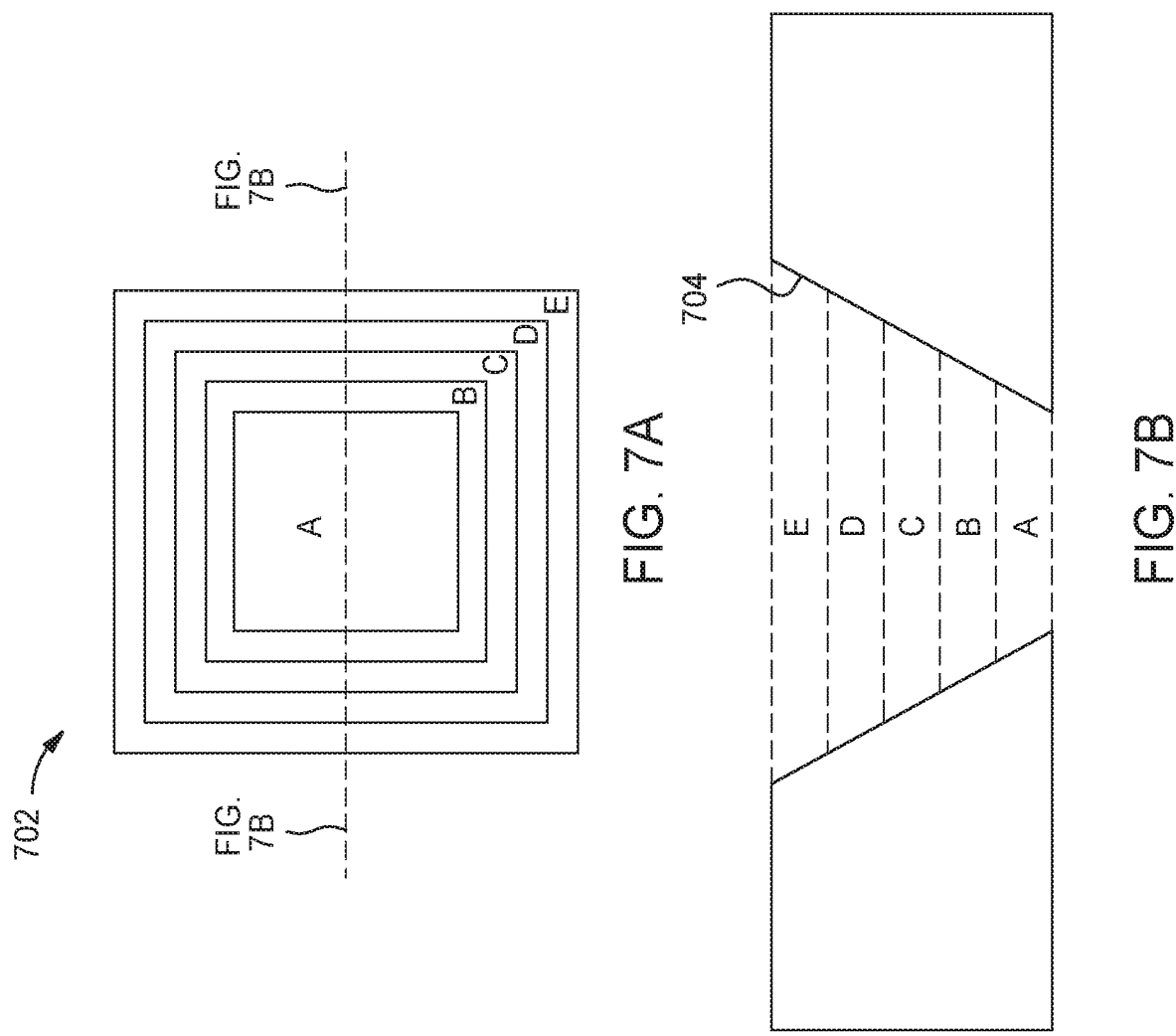
FIG. 7A
FIG. 7B

MASKLESS BASED LITHOGRAPHY METHODS

BACKGROUND

Field

Embodiments described herein generally relate to maskless based lithography methods and, more particularly, to methods of forming layers using maskless based lithography.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from a power supply is applied across the liquid crystal material, an amount of light passing through the liquid crystal material may be controlled at pixel locations enabling images to be generated.

Microlithography techniques are generally employed to create electrical features incorporated as part of the liquid crystal material layer forming the pixels. According to this technique, a light-sensitive photoresist is typically applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

Taper control is one technique well known in the art used to control the angle of a sidewall of the photoresist. Through this technique, a smooth taper profile can be provided to achieve good step-coverage for thin-film process as well as changing the angle of substrate structures to improve the out-coupling efficiency of organic light emitting diodes (OLEDs). Various methods, such as mask-based lithography systems, have been proposed to obtain controllability of the taper to create intermediate thickness patterns of photoresist. However, mask-based lithography systems can present problems. For example, to fine tune the taper angle, the mask is often removed and manipulated to prepare a more complex multitone, which is time consuming and costly. It is difficult to get the taper angle as desired due to the difficultly of adjusting transparency (the concept of multi-tone/gray-tone mask) of the mask or adjusting the fine grating/slit (concept of multi-tone/gray-tone mask) of the mask to obtain the appropriate energy that often exposes onto photoresist. Mask-based methods are also unlikely to achieve "multitone process and taper control" together in one printing step. Such methods often increase the complexity of the mask and mask cost. The more complex multi-tone/gray-tone mask decreases the yield of the mask production, thus tightening the process window of lithography process. Moreover, by including of the process variation from lithography process that could also impact the taper result and CD variation, mask processes require numerous experiments to re-do the mask, which lengthens the whole process verification since there is lead time of mask making.

Accordingly, there is a need in the art for methods using maskless based lithography to control the angle of the sidewall of the photoresist.

SUMMARY

One or more embodiments described herein generally relate to methods of forming layers using maskless based lithography.

In one embodiment, a method of forming a photoresist layer using maskless-based lithography includes obtaining a critical dimension of the photoresist layer; inputting a layer thickness and a taper control angle determined based on the critical dimension obtained; calculating a geometric distance of the photoresist layer using the layer thickness and the taper control angle; dividing the geometric distance into a plurality of sections; determining a width of each of the plurality of sections; and determining an amount of dose for each of the plurality of sections.

In another embodiment, a method of forming photoresist layers on a substrate using maskless-based lithography includes obtaining a first critical dimension of a first photoresist layer; inputting a first layer thickness and a first taper control angle determined based on the first critical dimension obtained; calculating a first geometric distance of the first photoresist layer using the first layer thickness and the first taper control angle; dividing the first geometric distance into a first plurality of sections; determining a first width of each of the first plurality of sections; determining a first amount of dose for each of the first plurality of sections; and forming a second photoresist layer on the first photoresist layer.

In another embodiment, a method of forming a photoresist layer with different photoresist residual thickness exceeding traditional multi-tone/gray-tone mask features using maskless-based lithography includes obtaining a critical dimension of the photoresist layer; inputting a layer thickness and a taper control angle determined based on the critical dimension obtained; calculating a geometric distance of the photoresist layer using the layer thickness and the taper control angle; dividing the geometric distance into a plurality of sections; determining a width of each of the plurality of sections; determining an amount of the plurality of sections by target photoresist residual thickness; and determining an amount of dose for each of the plurality of sections.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 6A is a top view and FIG. 6B is a sectional view of a plurality of sections formed using reverse tone printing according to at least one embodiment described herein;

FIG. 7A is a top view and FIG. 7B is a sectional view of a plurality of sections formed using positive tone printing according to at least one embodiment described herein; and FIG. 8 is a schematic of the plurality of sections related to the amount accumulated dose according to at least one embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments described herein generally relate to methods of forming layers using maskless based lithography. In these embodiments, the methods implement ladders of dose change. By overlaying multiple dose changes to the intended area with a specific pattern design, a taper profile with fine tune taper angle capability can be achieved. When implementing ladders of dose change, the geometric shape can be divided into overlaying sections. The overlaying sections can include a different dose of each section so that a desired taper control can be achieved.

The taper control can be well-controlled due to the nature of pixel blending (PB) and the division of multiple exposure levels to create such a taper. The taper can be achieved by manipulating the geometry "mask data" into overlaying sections that are exposed by various doses controlled by PB exposure techniques. The amount of accumulated energy from each different section penetrates through an amount of depth of photoresist which forms smoother taper transition from bottom to top of the photoresist. In embodiments described herein, the methods can be applied to one dimensional (1D) line-space design patterns and two dimensional (2D) line-space design patterns. To perform the methods described herein, a maskless lithography tool is used. The maskless lithography tool includes a controller that performs software based "mask data" manipulation. As such, multilayer taper control can be achieved without any additional steps. Additionally, because the methods are performed by software with no mask, there is much more flexibility to tune the taper angle without any additional mask cost and fabrication time, providing advantages over conventional lithography methods using masks.

Figure 1:
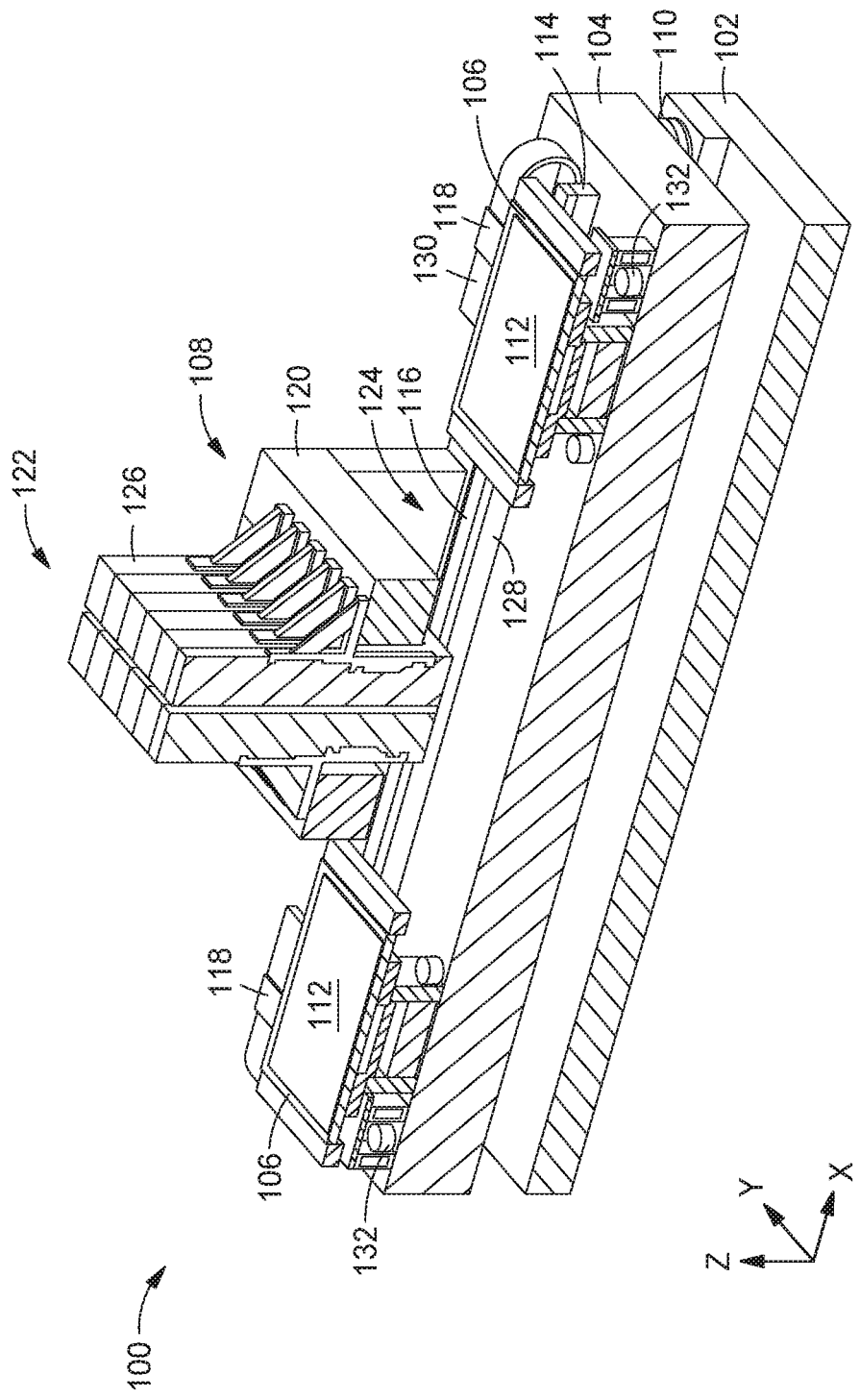
FIG. 1 is a perspective view of a system according to at least one embodiment described herein.

FIG. 1 is a perspective view of a system 100 according to at least one embodiment described herein. The system 100 includes a base frame 102, a slab 104, two or more stages 106, and a processing apparatus 108. In certain embodiments, one stage 106 may be used. The base frame 102 may rest on the floor of a fabrication facility and supports the slab 104. Passive air isolators 110 are positioned between the base frame 102 and the slab 104. The slab 104 may be a monolithic piece of granite, and the two or more stages 106 are disposed on the slab 104. A substrate 112 is supported by each of the two or more stages 106. A plurality of holes (not shown) are formed in the stage 106 for allowing a plurality of lift pins (not shown) to extend therethrough. The lift pins may rise to an extended position to receive the substrate 112, such as from a transfer robot (not shown). The transfer robot positions the substrate 112 on the lift pins, and the lift pins gently lower the substrate 112 onto the stage 106.

The substrate 112 may, for example, be made of quartz and be used as part of a flat panel display. In other embodiments, the substrate 112 may be made of other materials. In some embodiments, the substrate 112 may have a photoresist layer formed thereon. A photoresist is sensitive to radiation and may be a positive photoresist or a negative photoresist, meaning that portions of the photoresist exposed to radiation are respectively soluble or insoluble to a photoresist developer applied to the photoresist after the pattern is written into the photoresist. The chemical composition of the photoresist determines whether the photoresist is a positive photoresist or negative photoresist. Exemplary composition of the photoresist may include at least one of diazonaphthoquinone, a phenol formaldehyde resin, poly (methyl methacrylate), poly(methyl glutarimide), and SU-8. In this manner, the pattern may be created on a surface of the substrate 112 to form the electronic circuitry.

The system 100 includes a pair of supports 114 and a pair of tracks 116. The pair of supports 114 are disposed on the slab 104, and the slab 104 and the pair of supports 114 may be a single piece of material. The pair of tracks 116 are supported by the pair of the supports 114, and the two or more stages 106 may move along the tracks 116 in the X-direction. In one embodiment, the pair of tracks 116 is a pair of parallel magnetic channels. As shown, each track 116 of the pair of tracks 116 is linear. In other embodiments, the track 116 may have a non-linear shape. An encoder 118 is coupled to each stage 106 in order to provide location information to a controller 302 (See FIG. 3).

In these embodiments, the processing apparatus 108 includes a support 120 and a processing unit 122. The support 120 is disposed on the slab 104 and includes an opening 124 for the two or more stages 106 to pass under the processing unit 122. The processing unit 122 may be supported by the support 120. In some embodiments, the processing unit 122 is a pattern generator configured to expose a photoresist in a photolithography process. The pattern generator is configured to perform a maskless lithography process. The processing unit 122 may include a plurality of image projection systems (shown in FIG. 2) disposed in a case 126. The processing apparatus 108 may be utilized to perform maskless direct patterning. During operation, one of the two or more stages 106 moves in the X-direction from a loading position, as shown in FIG. 1, to a processing position. The processing position may refer to one or more positions of the stage 106 as the stage 106 passes under the processing unit 122. During operation, the two or more stages 106 are lifted by a plurality of air bearings 132 and move along the pair of tracks 116 from the loading position to the processing position. Each of the two or more stages 106 may also move in the Y-direction by moving along a track 130 for processing and/or indexing the substrate 106.

Figure 2:
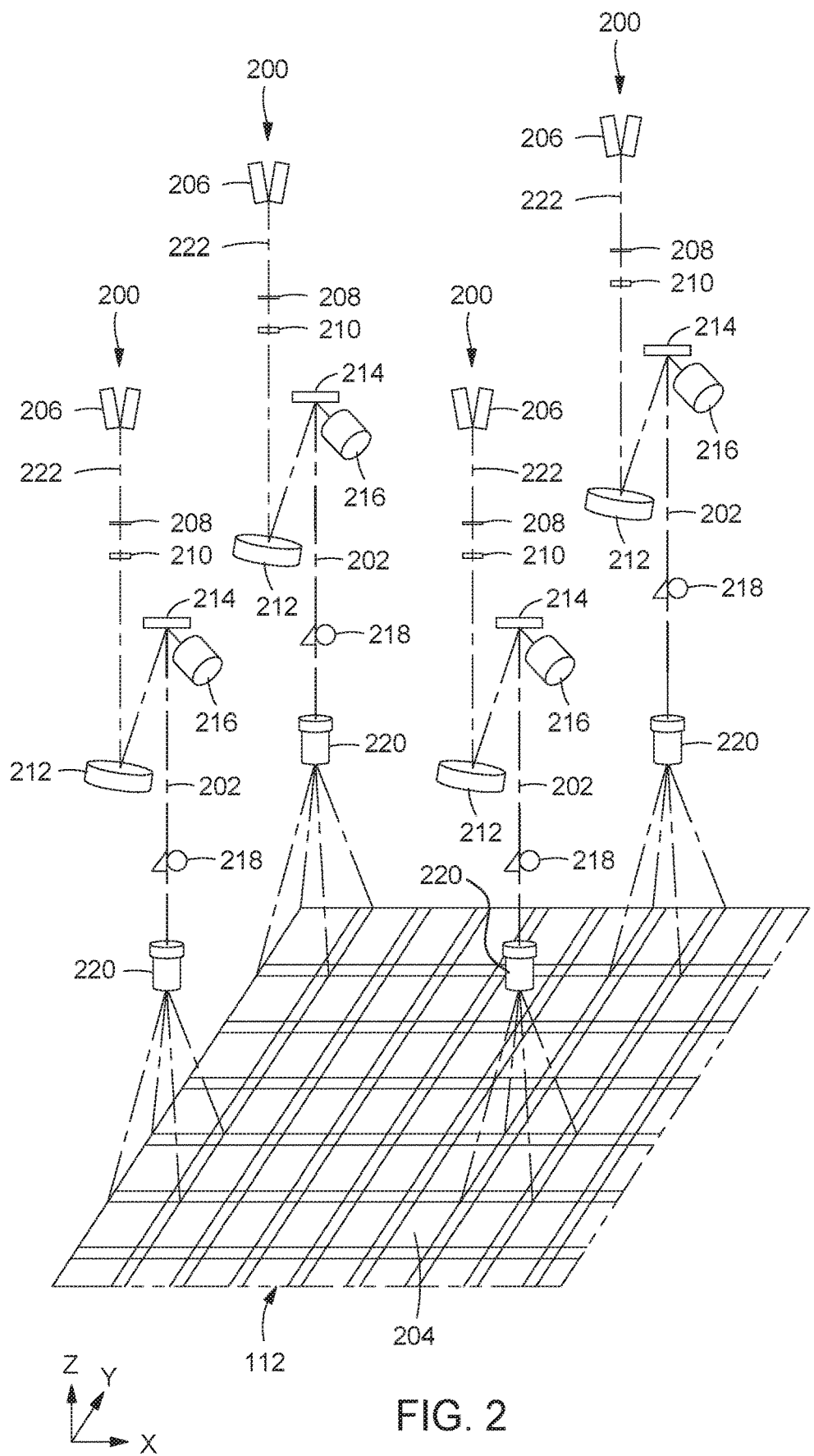
FIG. 2 is a schematic view of a plurality of image projection systems according to at least one embodiment described herein.

FIG. 2 is a perspective schematic view of a plurality of image projection systems 200 according to at least one embodiment described herein. In these embodiments, each image projection system 200 produces a plurality of beams 202 onto a surface 204 of the substrate 112. As the substrate 112 moves in the X-direction and Y-direction, the entire surface 204 is patterned by the beams 202. The number of the image projection systems 200 varies based on the size of the substrate 112 and/or the speed of stage 106 (FIG. 1).

In these embodiments, each of the image projection systems 200 includes a light source 206, an aperture 208, a lens 210, a mirror 212, a digital mirror device (DMD) 214, a light dump 216, a camera 218, and a projection lens 220. The light source 206 may be a light emitting diode (LED) or a laser, and the light source 206 may be capable of producing a light having predetermined wavelength. In some embodiments, the predetermined wavelength is in the blue or near ultraviolet (UV) range, such as less than about 450 nm. The mirror 212 may be a spherical mirror. The projection lens 220 may be a 10X objective lens. The DMD 214 may include a plurality of mirrors, and the number of mirrors may correspond to the resolution of the projected image.

During operation, a beam 222 having a predetermined wavelength, such as a wavelength in the blue range, is produced by the light source 206. The beam 222 is reflected to the DMD 214 by the mirror 212. The DMD 214 includes a plurality of mirrors that may be controlled individually, and each mirror of the plurality of mirrors of the DMD 214 may be at "on" position or "off" position, based on the mask data provided to the DMD 214 by the controller 302, further described below in FIG. 3. When the beam 222 reaches the mirrors of the DMD 214, the mirrors that are at "on" position reflect the beam 222, i.e., forming the plurality of beams 202, to the projection lens 220. The projection lens 220 then projects the beams 202 to the surface 204 of the substrate 112. The mirrors that are at "off" position reflect the beam 222 to the light dump 216 instead of the surface 204 of the substrate 112.

Figure 3:
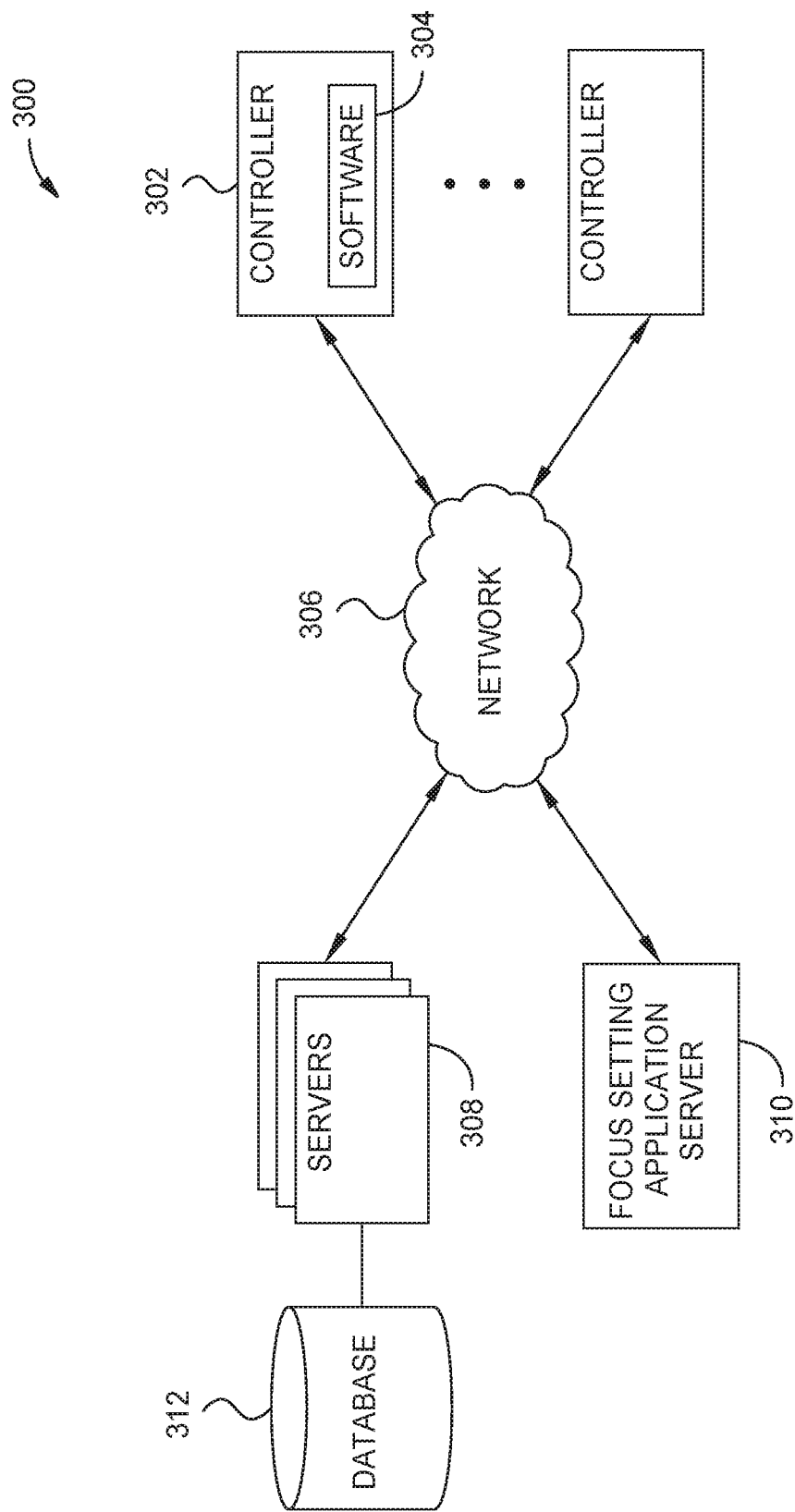
FIG. 3 illustrates a computing system according to at least one embodiment described herein.

FIG. 3 illustrates a computing system 300 according to at least one embodiment described herein. As shown, the computing system 300 includes a plurality of servers 308, a focus setting application server 310, and a plurality of controllers 302 (only two of which are shown for clarity), each connected to a communications network 306 (for example, the Internet). The servers 308 may communicate with the database 312 via a local connection (for example, a Storage Area Network (SAN) or Network Attached Storage (NAS)) or over the Internet. The servers 308 are configured to either directly access data included in the database 312 or to interface with a database manager that is configured to manage data included within the database 312.

Each controller 302 may include conventional components of a computing device, for example, a processor, system memory, a hard disk drive, a battery, input devices such as a mouse and a keyboard, and/or output devices such as a monitor or graphical user interface, and/or a combination input/output device such as a touchscreen which not only receives input but also displays output. Each server 308 and the focus setting application server 310 may include a processor and a system memory (not shown), and may be configured to manage content stored in database 312 using, for example, relational database software and/or a file system. The servers 308 may be programmed to communicate with one another, the controllers 302, and the focus setting application server 310 using a network protocol such as, for example, the TCP/IP protocol. The focus setting application server 310 may communicate directly with the controllers 302 through the communications network 306. The controllers 302 are programmed to execute software 304, such as programs and/or other software applications, and access applications managed by servers 308.

In the embodiments described herein, users may respectively operate the controllers 302 that may be connected to the servers 308 over the communications network 306. Pages, images, data, documents, and the like may be displayed to a user via the controllers 302. Information and images may be displayed through a display device and/or a graphical user interface in communication with the controller 302.

It is noted that the controller 302 may be a personal computer, laptop mobile computing device, smart phone, video game console, home digital media player, network-connected television, set top box, and/or other computing devices having components suitable for communicating with the communications network 306 and/or the required applications or software. The controller 302 is configured to operate the method 400 below, and may also execute other software applications.

Figure 4:
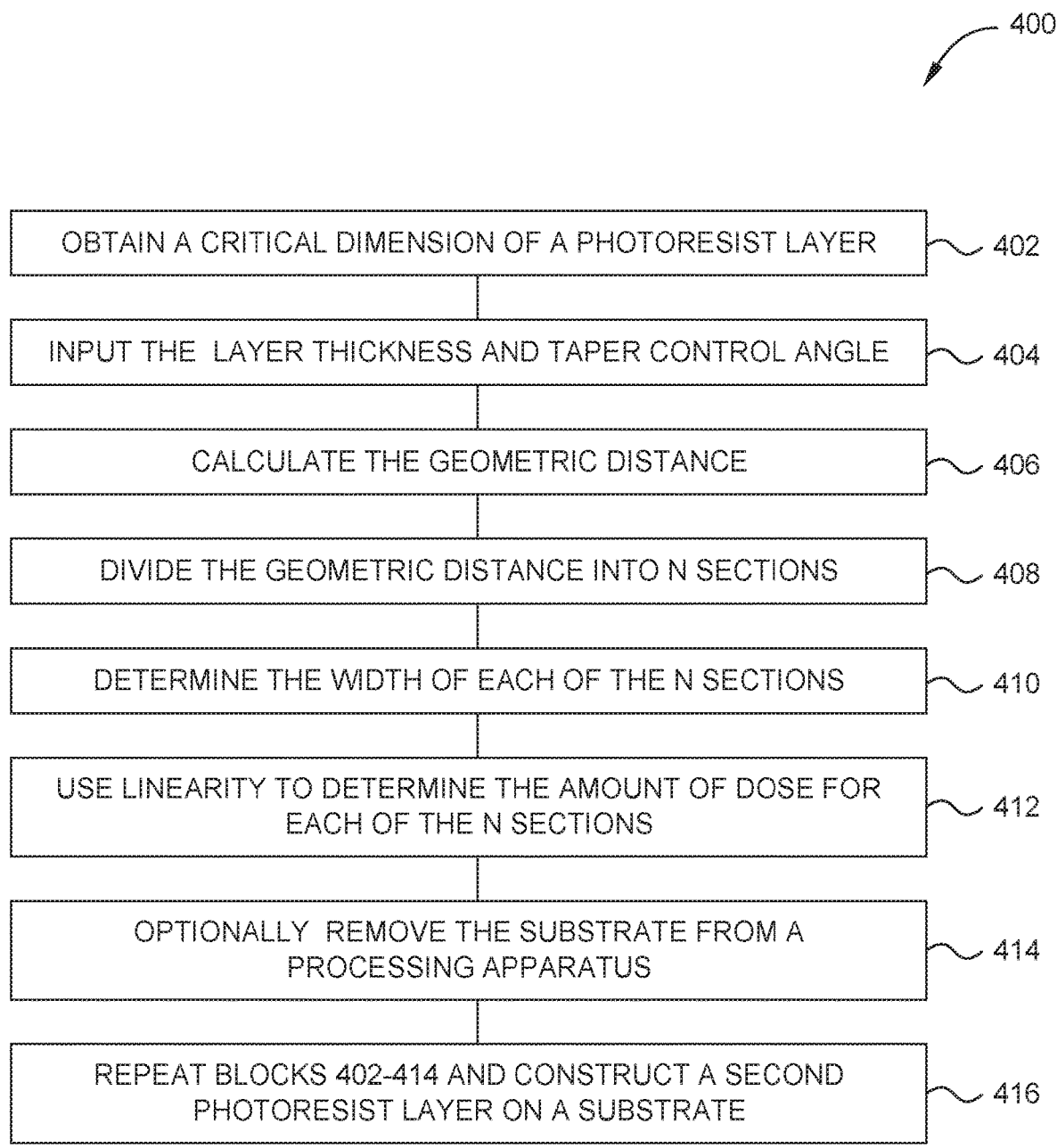
FIG. 4 is a flow chart of a method according to at least one embodiment described herein.
Figure 5A:
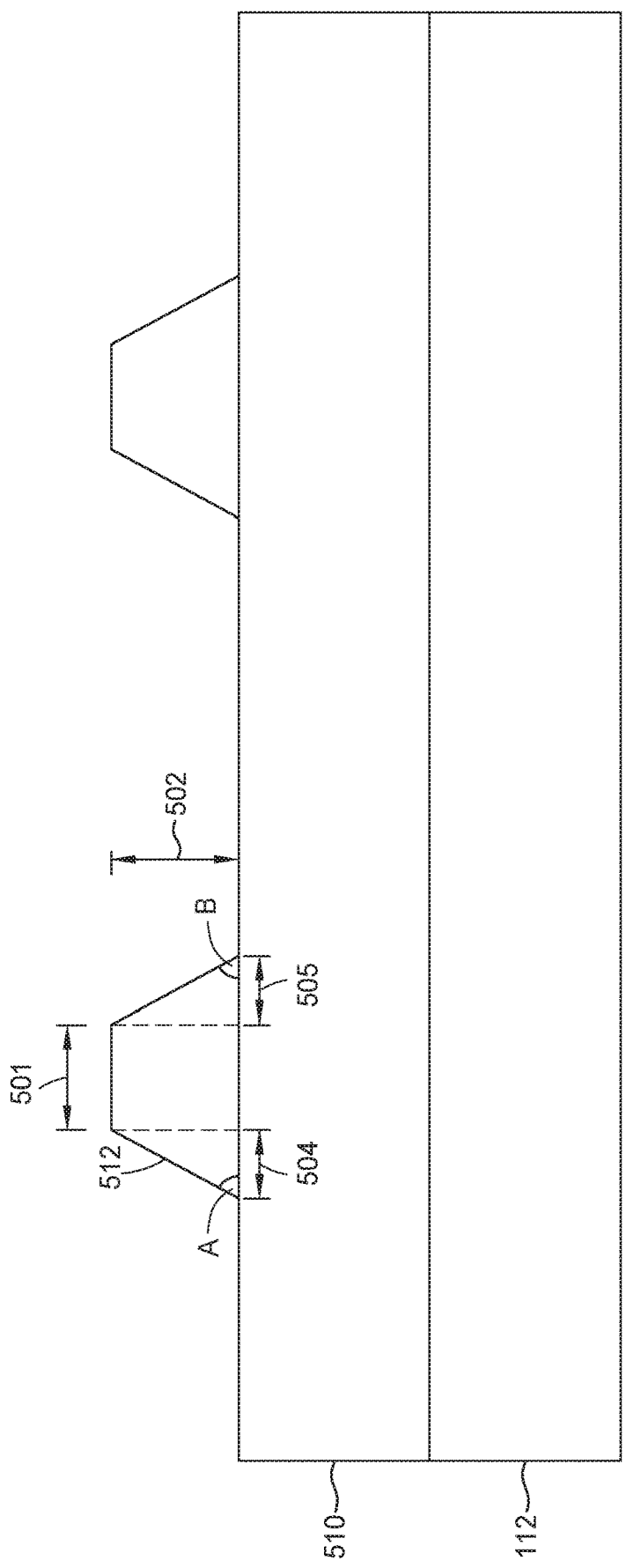
FIGS. 5A-5B are schematic views of layers formed on a substrate according to at least one embodiment described herein.
Figure 5B:
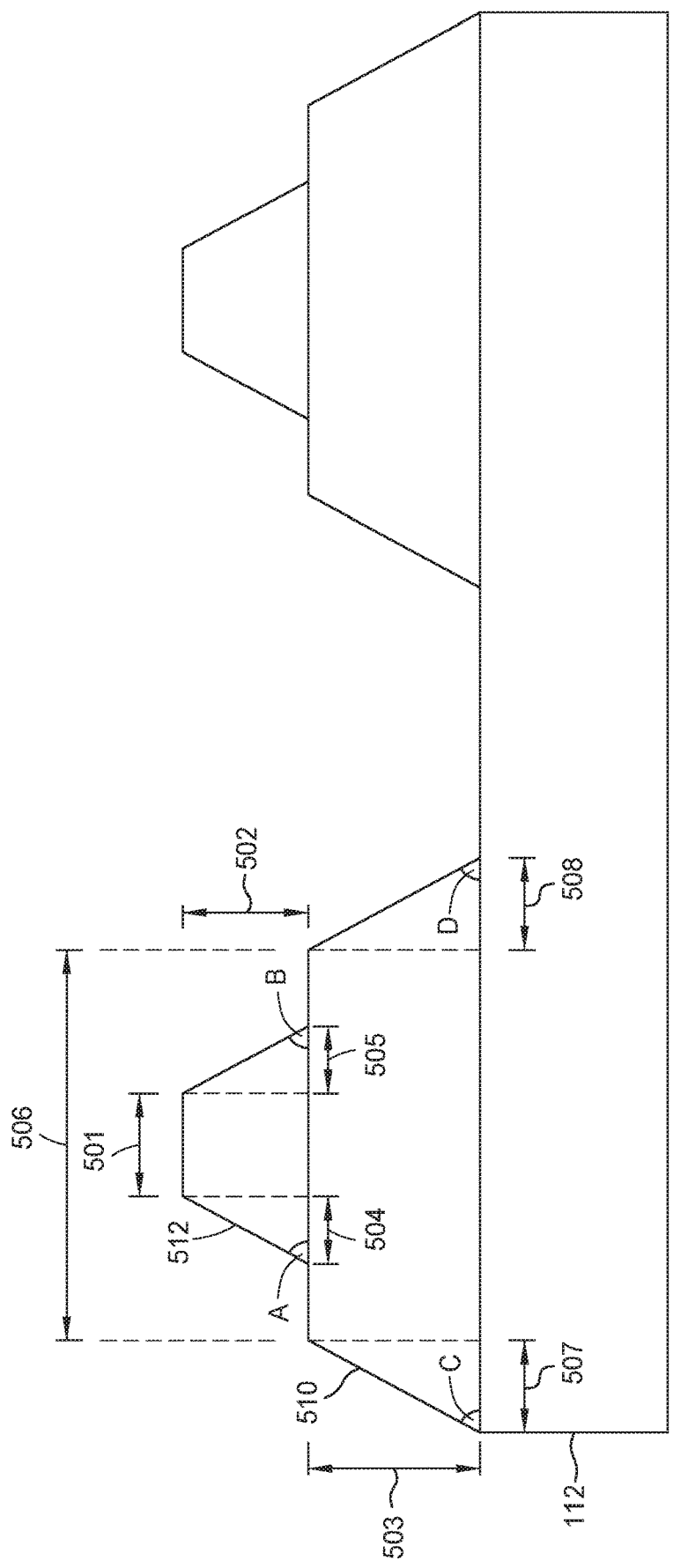

FIG. 4 is a flow chart of a method 400 according to at least one embodiment described herein. In these embodiments, the method 400 is performed with the systems and devices described in FIGS. 1-3 above, but is not limited to these systems and devices and can be performed with other similar systems and devices. The method 400 forms a photoresist layer using maskless-based lithography. FIGS. 5A-5B are schematic views of layers formed on a substrate according to at least one embodiment described herein. FIG. 6A is a top view and FIG. 6B is a sectional view of a plurality of sections formed using reverse tone printing according to at least one embodiment described herein. FIG. 7A is a top view and FIG. 7B is a sectional view of a plurality of sections formed using positive tone printing according to at least one embodiment described herein. FIG. 8 is a schematic of the plurality of sections related to the amount accumulated dose according to at least one embodiment described herein. FIGS. 5A-8 help explain the method 400.

In block 402, a critical dimension may be obtained using a critical dimension scanning electron microscope (CD-SEM). In other embodiments, a critical dimension may be obtained using a scanning electron microscope (SEM), a reflectometer thin film gauge, an ellipsometer thin film gauge, an atomic force microscope (AFM), a focused ion beam (FIB), a white light interferometry (WLI), a contact/non-contact type roughness gauge, or other similar devices. The critical dimensions obtained can be critical dimension 501 shown in FIG. 5A. In block 404, a layer thickness, such as a first layer thickness 502, and a taper control angle, such as angles A and B shown in FIG. 5A, are inputted in the controller 302. The first layer thickness 502 is determined by the thickness at the critical dimension 501, for example. The angles A and B are the angles between the surface of a second photoresist layer 510 and the top of the critical dimension 501. In block 406, a geometric distance, such as geometric distances 504 and 505 shown in FIG. 5A, are calculated by using the first layer thickness 502 and the angles A and B. More specifically, the geometric distances 504 and 505 are calculated by dividing the first layer thickness 502 by the tangent of the angles A and B. For example, this calculation can be represented by the equation following equation:

$$Z = X/\tan(Y)$$

Z is the geometric distance 504 or 505, X is the first layer thickness 502, and Y is the angle A or B. In some embodiments, the first layer thickness 502 is 4.5 μm, but can be other thicknesses.

In block 408, the geometric distances of the photoresist layers 604 and 704 are divided into a plurality of sections 602 or 702 (FIGS. 6A and 7A). For example, the plurality of sections 602 and 702 can be divided into five sections, which are represented by section A, section B, section C, section D, and section E as shown in FIGS. 6A and 7A. In block 410, the width of each of the plurality of sections 602 or 702 is determined. In this example, the width of each of the sections A-E can be found using the equations below. The width of each of the sections A-E are represented by width A, width B, width C, width D, and width E as shown in FIGS. 6B and 7B. The equations are as follows:

Width $A$=critical dimension

Width $B=A+Z/(N-1)*2$

Width $C=A+Z/(N-1)*4$

Width $D=A+Z/(N-1)*6$

Width $E=A+Z/(N-1)*8$

Z is the geometric distance, and N is total the number of sections (five in the example shown in FIGS. 6A and 7A).

In block 412, linearity is used to determine the amount of dose for each of the plurality of the sections 602 and 702. First, there is a linear relationship between the depth into the layer and the width of the layer. For reverse tone printing, as shown in FIGS. 6A-6B, the width increases linearly with the increase of the depth into the photoresist layer 604. For example, width E is the largest at section E in FIG. 6B. Section E is the section located the deepest into the layer 604. Width A is the smallest at section A in FIG. 6B, which corresponds to the top surface of the photoresist layer 604 so the depth is zero to minimal. It is vice versa for positive tone printing as shown in FIGS. 7A-7B. In this embodiment, the width decreases linearly with the increase of the depth into a photoresist layer 704.

Second, there is a linear relationship between the depth into the layer and the amount of dose, as shown in the schematic 802 in FIG. 8. In reverse tone printing, as the depth of the photoresist layer increases, the amount of dose increases linearly. Therefore, the amount of dose also increases linearly with the increase in width, as the width increases linearly with depth, discussed above. For positive tone printing, the amount of dose decreases linearly with the increase in width, as the depth decreases linearly with increase of width. FIG. 6B shows the width and the depth of each of the plurality of sections 602 of the photoresist layer 604. As shown, the width and depth increases from section A to section E in reverse tone printing. Section A has the smallest width and depth, and section E has the largest width and depth in reverse tone printing. The amount of dose decreases linearly as the width and depth increases decreases. Conversely, FIG. 7B shows the width increasing as the depth decreases for positive tone printing of each of the plurality of sections 702 of the photoresist layer 704. Section A has smallest width but with largest depth and section E has largest width with smallest depth. Therefore, section A has the least amount of dose, and section E has the greatest amount of dose for reverse tone and vice versa for positive tone, creating an "overlay dose". In other words, if the geometric shape of a first photoresist layer 512 (FIGS. 5A-5B) is divided into some overlaying sections, such as the plurality of sections 602 and 702, taper control can be achieved. Thus in reverse tone, an island or line is created and in positive tone, a trench or via is created based on the geometry design.

In the five section first layer 512, the basic concept is the total overlaying dose of each layer meets the dose threshold of photoresist. Due to overlaying feature, the dose of each section can be accumulated. For example, the section E dose can be 20%, the section D dose can be 40%, the section C dose can be 60%, section B dose can be 80%, and the section A dose can be 100%, however these amount of doses can vary. In other embodiments, by well shifting of each section's position, the asymmetric taper can be implemented with any desired angles.

In some embodiments, the method 400 produces a multitone application as shown in FIG. 5B. Multitone includes of two or more layer topography with a same or different thickness. FIG. 5B shows a reverse tone for two layer topography, but it can also be applied in positive tone and/or multiple layer topography. First by applying the presented blocks 402-412 of the method 400 described above, the first layer 512 with the angles A and B and the first thickness 502 is formed. In block 414, the substrate 112 can be optionally removed from a processing apparatus. However, in other embodiments, the method 400 can be performed without needing development of the first layer 512. In block 416, the same blocks 402-412 used to form the first layer 512 can be used to form the second layer 510. As shown in FIG. 5B, a second layer thickness 503 is determined by the thickness at a critical dimension 506. Geometric distances 507 and 508 are calculated using the second layer thickness 503 and angles C and D, so that a second layer 510 can be formed as desired on the substrate 112. Note that when constructing the second layer 510, the accumulated dose can be added from the first layer 512 accumulated dose. For multitone application, both reverse tone and positive tone can be applied simultaneously if the desired topography includes an island and a trench. Although a positive resist is described in these embodiments, these embodiments can be configured to construct a negative resist.

The method 400 advantageously uses a maskless lithography tool to easily achieve taper control. As such, multilayer taper control can be achieved without any additional steps. Additionally, because the method 400 is performed by software with no mask, there is much more flexibility to tune the taper angle without any additional mask cost and fabrication time, to implement 3D symmetric or asymmetric taper walls with any desired angles for any shape of pattern locally or globally on a substrate, providing advantages over conventional lithography methods using masks.

By adjusting the quantity of sections, gray tone exposure is achievable with any desired thickness of PR residual (for positive PR and negative PR both) for any shape of pattern locally or globally on a substrate, and capable to be freely composited with the tapers derived above, providing further advantages over conventional lithography methods using masks.

While the foregoing is directed to embodiments of the present disclosure, other and further embodiments of the disclosure may be devised without departing from the basic scope thereof, and the scope thereof is determined by the claims that follow.

We claim:
1. A method of forming a photoresist layer using maskless-based lithography, comprising:
   obtaining a critical dimension of the photoresist layer;
   inputting a layer thickness and a taper control angle determined based on the critical dimension obtained;
   calculating a geometric distance of the photoresist layer using the layer thickness and the taper control angle;

dividing the geometric distance into a plurality of sections;
determining a width of each of the plurality of sections; and
determining an amount of dose for each of the plurality of sections.

2. The method of claim 1, wherein the plurality of sections comprises a section A, a section B, a section C, a section D, and a section E.

3. The method of claim 2, wherein a total dose of section B is 20% less than a total dose of section A.

4. The method of claim 3, wherein a total dose of section C is 20% less than the total dose of section B.

5. The method of claim 4, wherein a total dose of section D is 20% less than the total dose of section C, and a total dose of section E is 20% less than the total dose of section D.

6. A method of forming photoresist layers on a substrate using maskless-based lithography, comprising:
obtaining a first critical dimension of a first photoresist layer;
inputting a first layer thickness and a first taper control angle determined based on the first critical dimension obtained;
calculating a first geometric distance of the first photoresist layer using the first layer thickness and the first taper control angle;
dividing the first geometric distance into a first plurality of sections;
determining a first width of each of the first plurality of sections;
determining a first amount of dose for each of the first plurality of sections; and
forming a second photoresist layer on the first photoresist layer.

7. The method of claim 6, further comprising:
obtaining a second critical dimension of the second photoresist layer;
inputting a second layer thickness and a second taper control angle determined based on the second critical dimension obtained;
calculating a second geometric distance of the second photoresist layer using the second layer thickness and the second taper control angle;
dividing the second geometric distance into a second plurality of sections;
determining a second width of each of the second plurality of sections; and
determining a second amount of dose for each of the plurality of sections.

8. The method of claim 7, wherein the method is performed without removing the substrate from a processing apparatus.

9. The method of claim 7, wherein the method is performed with removing the substrate from a processing apparatus before forming the second photoresist layer.

10. A method of forming a photoresist layer with different photoresist residual thickness exceeding traditional multi-tone/gray-tone mask features using maskless-based lithography, comprising:
obtaining a critical dimension of the photoresist layer;
inputting a layer thickness and a taper control angle determined based on the critical dimension obtained;
calculating a geometric distance of the photoresist layer using the layer thickness and the taper control angle;
dividing the geometric distance into a plurality of sections;
determining a width of each of the plurality of sections;
determining an amount of the plurality of sections by target photoresist residual thickness; and
determining an amount of dose for each of the plurality of sections.

11. The method of claim 10, wherein the plurality of sections comprises a section A, a section B, a section C, and a section D.

12. The method of claim 11, wherein a total dose of section B is 20% less than a total dose of section A.

13. The method of claim 12, wherein a total dose of section C is 20% less than the total dose of section B.

14. The method of claim 13, wherein a total dose of section D is 20% less than the total dose of section C.

15. The method of claim 10, wherein the photoresist layer is a positive resist or a negative resist.

* * * * *